(12) United States Patent
Fang et al.

(10) Patent No.: US 11,183,549 B2
(45) Date of Patent: Nov. 23, 2021

(54) DOUBLE-SIDED ORGANIC LIGHT EMITTING DIODE (OLED) DISPLAY PANEL AND MANUFACTURING METHOD

(71) Applicant: SHENZHEN CHINA STAR OPTOELECTRONICS SEMICONDUCTOR DISPLAY TECHNOLOGY CO., LTD., Shenzhen (CN)

(72) Inventors: Chunhsiung Fang, Shenzhen (CN); Yuanchun Wu, Shenzhen (CN)

( * ) Notice: Subject to any disclaimer, the term of this patent is extended or adjusted under 35 U.S.C. 154(b) by 211 days.

(21) Appl. No.: 16/627,793

(22) PCT Filed: Dec. 13, 2019

(86) PCT No.: PCT/CN2019/124984
§ 371 (c)(1),
(2) Date: Dec. 31, 2019

(87) PCT Pub. No.: WO2021/103162
PCT Pub. Date: Jun. 3, 2021

(65) Prior Publication Data
US 2021/0335962 A1 Oct. 28, 2021

(30) Foreign Application Priority Data
Nov. 28, 2019 (CN) .......................... 201911195794.0

(51) Int. Cl.
*H01L 29/08* (2006.01)
*H01L 27/32* (2006.01)
*H01L 51/52* (2006.01)
*H01L 51/56* (2006.01)

(52) U.S. Cl.
CPC ...... *H01L 27/3267* (2013.01); *H01L 51/5218* (2013.01); *H01L 51/5221* (2013.01); *H01L 51/56* (2013.01); *H01L 2251/5323* (2013.01); *H01L 2251/558* (2013.01)

(58) Field of Classification Search
CPC ............ H01L 27/3258; H01L 27/3267; H01L 51/5218; H01L 51/5221
See application file for complete search history.

(56) References Cited

U.S. PATENT DOCUMENTS

| 9,768,404 B1* | 9/2017 | Steckel ................. H01L 51/506 |
| 10,340,323 B2* | 7/2019 | Nie ...................... H01L 27/3246 |
| 2005/0258740 A1 | 11/2005 | Kim |
| 2005/0264184 A1 | 12/2005 | Park et al. |

(Continued)

FOREIGN PATENT DOCUMENTS

| CN | 1700828 A | 11/2005 |
| CN | 101976544 A | 2/2011 |

(Continued)

*Primary Examiner* — Phuc T Dang

(57) ABSTRACT

A double-sided organic light emitting diode (OLED) display panel is disclosed and includes a plurality of sub-pixels each of which has a top emission region and a bottom emission region. The top emission region has a first anode metal layer, a first OLED device layer, a first cathode metal layer, and an organic barrier layer. The bottom emission region has a second anode metal layer, a second OLED device layer, and a second cathode metal layer. The present invention can reduce an overall thickness of the double-sided OLED display panel.

14 Claims, 11 Drawing Sheets

(56) References Cited

U.S. PATENT DOCUMENTS

| | | |
|---|---|---|
| 2016/0268362 A1 | 9/2016 | Shi et al. |
| 2017/0040405 A1 | 2/2017 | Zhang et al. |
| 2018/0219123 A1* | 8/2018 | Wang .................... H01L 27/15 |
| 2018/0301521 A1* | 10/2018 | Yang ................. H01L 27/3211 |
| 2019/0013377 A1 | 1/2019 | Nie |
| 2019/0189727 A1 | 6/2019 | Kim et al. |
| 2020/0365828 A1 | 11/2020 | Kishimoto |

FOREIGN PATENT DOCUMENTS

| | | |
|---|---|---|
| CN | 103730484 A | 4/2014 |
| CN | 104701351 A | 6/2015 |
| CN | 107564940 A | 1/2018 |
| CN | 109935202 A | 6/2019 |
| CN | 110112183 A | 8/2019 |
| CN | 110233168 A | 9/2019 |
| CN | 110235521 A | 9/2019 |
| JP | 2000058260 A | 2/2000 |

* cited by examiner

DOUBLE-SIDED ORGANIC LIGHT EMITTING DIODE (OLED) DISPLAY PANEL AND MANUFACTURING METHOD

FIELD OF INVENTION

The present invention relates to a field of display technologies, especially relates to a double-sided OLED display panel and a manufacturing method.

BACKGROUND OF INVENTION

An organic light emitting diode (OLED) display has many advantages of self-luminescence, low driving voltage, high light emitting efficiency, fast response times, high contrast, wide angles of view, extensive workable temperature ranges, and achievement of flexible display and large size full screen, and is recognized by the industry as the most promising display.

With the development of display technology, consumers not only require the display to have a fast response speed, a high resolution, and an exquisite picture quality, but also to pursue breakthroughs in functions and display modes. Therefore, a double-sided OLED display has been developed. The double-sided OLED display not only has the various characteristics of ordinary OLED displays, but also extends the screen space and quickly switches and process a plurality of display screens, which has a huge application space in advertisement and portable electronics.

At present a common double-sided OLED display is designed by bonding rears of two OLED backplates together for achieving the double-sided display. However, such design needs two individual OLED display panels and four glass substrates are required such that a thickness of the display is greater, structures and processes thereof are more complicated, and the manufacturing cost thereof is higher, which fails to match requirements of light weight, compactness, and a high performance-price ratio as expected by consumers.

As described above, the conventional double-sided OLED display panel bonds rears of two OLED backplates together for achieving the double-sided display such that a thickness of the display is greater, structures and processes thereof are more complicated, and the manufacturing cost thereof is higher, which fails to match requirements of light weight, compactness, and a high performance-price ratio as expected by consumers.

SUMMARY OF INVENTION

Technical Solution

In a first aspect, an embodiment of the present invention provides a double-sided organic light emitting diode (OLED) display panel, wherein the double-sided OLED display panel comprises a plurality of sub-pixels, each of the sub-pixels comprises a top emission region and a bottom emission region, wherein the double-sided OLED display panel comprises: an underlay substrate, a thin film transistor array layer, a planarization layer, a first anode metal layer and a second anode metal layer disposed on the planarization layer and arranged as a same layer, a pixel definition layer, a first OLED device layer and second OLED device layer arranged as a same layer, a first cathode metal layer and a second cathode metal layer disposed on the pixel definition layer and arranged as a same layer, an organic barrier layer disposed on the first cathode metal layer, and a glass cover lid covering the organic barrier layer and the second cathode metal layer;

wherein the first anode metal layer, the first OLED device layer, the first cathode metal layer, and the organic barrier layer is located in the top emission region, the second anode metal layer, the second OLED device layer, and the second cathode metal layer are located in the bottom emission region; in each of columns of the sub-pixels, the top emission region is connected to a scan line, the bottom emission region is connected another scan line, and the top emission region and the bottom emission region share a data line.

In the double-sided OLED display panel, the thin film transistor array layer comprises a first thin film transistor array layer configured to drive the top emission region and a second thin film transistor array layer configured to drive the bottom emission region, the first thin film transistor array layer is located in the top emission region, and the second thin film transistor array layer is located entirely or partially in the top emission region.

In the double-sided OLED display panel, the first anode metal layer is a triple-layered indium tin oxide/silver/indium tin oxide (ITO/Ag/ITO) conductive layer, and the second anode metal layer is a single-layered ITO conductive layer.

In the double-sided OLED display panel, the first cathode metal layer is a double-layered magnesium/silver (Mg/Ag) conductive layer, the second cathode metal layer comprises a portion of the first cathode metal layer and a Mg alloy metal layer that are stacked on each other from bottom to top.

In the double-sided OLED display panel, the organic barrier layer restricts a boundary of a side of the Mg alloy metal layer near the top emission region in the bottom emission region.

In a second aspect, an embodiment of the present invention also provides a double-sided organic light emitting diode (OLED) display panel, wherein the double-sided OLED display panel comprises a plurality of sub-pixels, each of the sub-pixels comprises a top emission region and a bottom emission region, wherein the double-sided OLED display panel comprises: an underlay substrate, a thin film transistor array layer, a planarization layer, a first anode metal layer and a second anode metal layer disposed on the planarization layer and arranged as a same layer, a pixel definition layer, a first OLED device layer and second OLED device layer arranged as a same layer, a first cathode metal layer and a second cathode metal layer disposed on the pixel definition layer and arranged as a same layer, an organic barrier layer disposed on the first cathode metal layer, and a glass cover lid covering the organic barrier layer and the second cathode metal layer;

wherein the first anode metal layer, the first OLED device layer, the first cathode metal layer, and the organic barrier layer is located in the top emission region, the second anode metal layer, the second OLED device layer, and the second cathode metal layer are located in the bottom emission region.

In the double-sided OLED display panel, the thin film transistor array layer comprises a first thin film transistor array layer configured to drive the top emission region and a second thin film transistor array layer configured to drive the bottom emission region, the first thin film transistor array layer is located in the top emission region, and the second thin film transistor array layer is located entirely or partially in the top emission region.

In the double-sided OLED display panel, the first anode metal layer is a triple-layered indium tin oxide/silver/indium tin oxide (ITO/Ag/ITO) conductive layer, and the second anode metal layer is a single-layered ITO conductive layer.

In the double-sided OLED display panel, the first cathode metal layer is a double-layered magnesium/silver (Mg/Ag) conductive layer, the second cathode metal layer comprises a portion of the first cathode metal layer and a Mg alloy metal layer that are stacked on each other from bottom to top.

In the double-sided OLED display panel, the organic barrier layer restricts a boundary of a side of the Mg alloy metal layer near the top emission region in the bottom emission region.

In an aspect of a subcontractor, an embodiment of the present invention also provides a double-sided organic light emitting diode (OLED) display panel manufacturing method, wherein the method comprises:

a step S10, manufacturing a thin film transistor array layer on an underlay substrate by a semiconductor manufacturing process, each of sub-pixels corresponding to the thin film transistor array layer is classified into a top emission region and a bottom emission region;

a step S20, sequentially manufacturing a planarization layer and an OLED anode metal layer on the thin film transistor array layer, wherein the OLED anode metal layer comprises a first anode metal layer disposed on the top emission region and a second anode metal layer disposed on the bottom emission region;

a step S30, manufacturing a pixel definition layer above the OLED anode metal layer, wherein the pixel definition layer defines a first aperture region on the first anode metal layer, and the pixel definition layer defines a second aperture region on the second anode metal layer;

a step S40, manufacturing a first OLED device layer and a second OLED device layer on the OLED anode metal layer by a process, and manufacturing a first cathode metal layer on the first OLED device layer and the second OLED device layer;

a step S50, manufacturing an organic barrier layer on a portion of the first cathode metal layer in the top emission region;

a step S60, manufacturing a magnesium (Mg) alloy metal layer on a portion of the first cathode metal layer in the bottom emission region, wherein the Mg alloy metal layer and the portion of the first cathode metal layer in the bottom emission region commonly form a second cathode metal layer; and a step S70, disposing a glass cover lid covering the organic barrier layer and the Mg alloy metal layer to acquire the double-sided OLED display panel.

In the double-sided OLED display panel manufacturing method, in the step S10, the thin film transistor array layer comprises a first thin film transistor array layer configured to drive the top emission region and a second thin film transistor array layer configured to drive the bottom emission region, the first thin film transistor array layer is located in the top emission region, and the second thin film transistor array layer is located entirely or partially in the top emission region.

In the double-sided OLED display panel manufacturing method, in the step S20, the first anode metal layer is a triple-layered indium tin oxide/silver/indium tin oxide (ITO/Ag/ITO) conductive layer, and the second anode metal layer is a single-layered ITO conductive layer.

In the double-sided OLED display panel manufacturing method, in the step S40, the first cathode metal layer is a double-layered magnesium/silver (Mg/Ag) conductive layer.

Advantages

Compared to the prior art, the double-sided OLED display panel and the manufacturing method provided by the present invention divide each of the sub-pixels of one OLED backplate into the top emission region and the bottom emission region and achieve double-sided display of the OLED backplate, which can reduce an overall thickness of the double-sided OLED display panel, simplify the process, and further decrease the manufacturing cost of the double-sided OLED display panel.

DETAILED DESCRIPTION OF PREFERRED EMBODIMENTS

The present invention provides a double-sided OLED display panel and a manufacturing method. To make the objective, the technical solution, and the effect of the present invention clearer and more explicit, the present invention will be further described in detail below with reference to the accompanying drawings. It should be understood that the specific embodiments described here are only used to explain the present invention instead of being used to limit the present invention.

Figure 1:
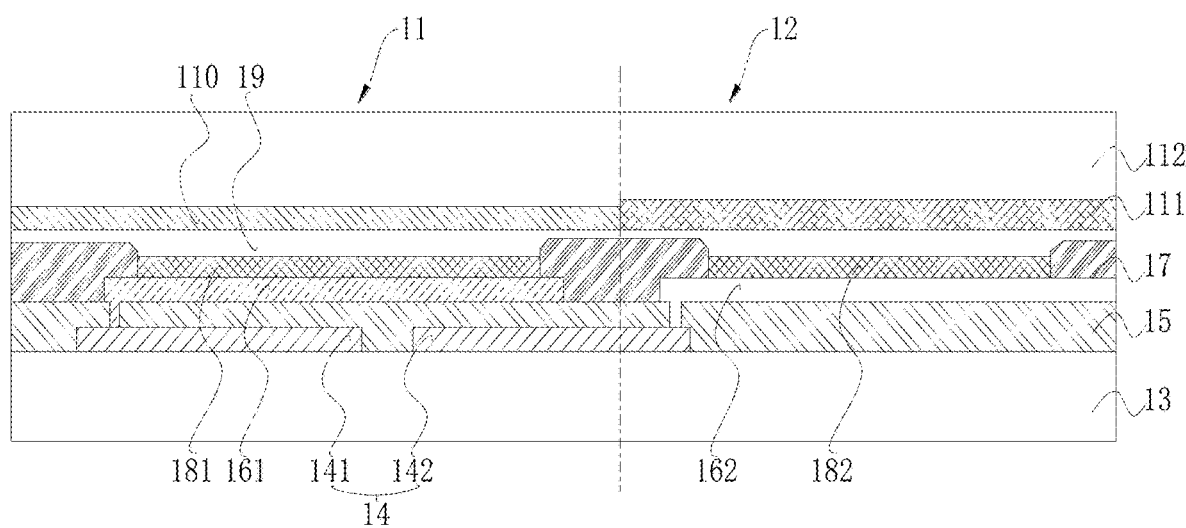
FIG. 1 is a schematic cross-sectional structural view of a double-sided OLED display panel of an embodiment of the present invention.

With reference to FIG. 1, FIG. 1 is a schematic cross-sectional structural view of a double-sided OLED display panel of an embodiment of the present invention. The double-sided OLED display panel comprises a plurality of sub-pixels, and each of the sub-pixels comprises a top emission region 11 and a bottom emission region 12.

Specifically, the double-sided OLED display panel further comprises: an underlay substrate 13, a thin film transistor array layer 14, a planarization layer 15, a first anode metal layer 161 and a second anode metal layer 162 disposed on the planarization layer 15 and arranged as a same layer, pixel definition layer 17, a first OLED device layer 181 and a second OLED device layer 182 arrange as a same layer, a first cathode metal layer 19 and a second cathode metal layer disposed on the pixel definition layer 17 and arranged as a same layer, an organic barrier layer 110 disposed on the first cathode metal layer 19, and a glass cover lid 112.

Specifically, the underlay substrate 13 is made of a flexible underlay material, which is preferably polyimide.

Specifically, the thin film transistor array layer 14 comprises a plurality of thin film transistors arranged in an array. Each of the thin film transistors comprises a source electrode, a drain electrode, a gate electrode, and an active layer. The thin film transistor array layer 14 comprises a first thin film transistor array layer 141 configured to drive the top emission region 11 and a second thin film transistor array layer 142 configured to drive the bottom emission region 12. The first thin film transistor array layer 141 is located in the top emission region 11, and the second thin film transistor array layer 142 is located entirely or partially in the top emission region 11. Because the device in the thin film transistor array layer 14 is made of metal and metal has a light shielding characteristic, the second OLED device layer 182 in the bottom emission region 12 needs to emit light through the second thin film transistor array layer 142 on a bottom, and the first OLED device layer 181 in the top emission region 11 directly emits light without passing through the bottom of the first thin film transistor array layer 141. Therefore, disposing the second thin film transistor array layer 142 entirely or partially in the top emission region 11 increases an aperture ratio of the bottom emission region 12.

Specifically, the planarization layer 15 is disposed on the underlay substrate 13 and covers the thin film transistor array layer 14, and a material of the planarization layer 15 is preferably an organic photoresist.

Specifically, the first anode metal layer 161 is located in the top emission region 11, the first anode metal layer 161 is disposed on the planarization layer 15 and is connected to the first thin film transistor array layer 141 through a first via hole. A material of the first anode metal layer 161 a triple-layered indium tin oxide/silver/indium tin oxide (ITO/Ag/ITO) conductive layer of a triple-layer composite film structure.

Specifically, the second anode metal layer 162 is located in the bottom emission region 12, and the second anode metal layer 12 is disposed on the planarization layer 15 and is connected to the second thin film transistor array layer 142 through a second via hole. A material of the second anode metal layer 162 is a single-layered ITO conductive layer.

Specifically, the pixel definition layer 17 is disposed on the planarization layer 15 and covers a portion of the first anode metal layer 161 and a portion of the second anode metal layer 162. The pixel definition layer 17 is configured to define an aperture region of the top emission region 11 and an aperture region of the bottom emission region 12. A material of the pixel definition layer 17 is preferably an organic photoresist.

Specifically, the first OLED device layer 181 is disposed on the first anode metal layer 161 and is located in the aperture region of the top emission region 11. The second OLED device layer 182 is disposed on the second anode metal layer 162 and is located in the aperture region of the bottom emission region 12. Preferably, both the first OLED device layer 181 and the second OLED device layer 182 are made of a white light emitting material.

Specifically, the first cathode metal layer 19 is disposed on the pixel definition layer 17 and fully covers the first OLED device layer 181 and the second OLED device layer 182; the first cathode metal layer 19 is a translucent material, and a material of the first cathode metal layer 19 is preferably a double-layered magnesium/silver (Mg/Ag) conductive layer of a double-layer composite film structure.

Specifically, an organic barrier layer 110 is manufactured on the portion of the first cathode metal layer 19 in the top emission region 11. The organic barrier layer 110 is selected from self-assembling optional organic materials, such materials suppress later vapor deposition of a metal film of a self-assembling optional metal material thereon.

Specifically, a Mg alloy metal layer 111 is manufactured on the portion of the first cathode metal layer 19 in the bottom emission region 12, and the Mg alloy metal layer 111 is selected from self-assembling optional metal materials. The organic barrier layer 110 restricts a boundary of a side of the Mg alloy metal layer 111 near the top emission region 11 in the bottom emission region 12.

Specifically, the portion of the first cathode metal layer 19 in the bottom emission region 12 and the Mg alloy metal layer 111 form the second cathode metal layer in the bottom emission region 12.

Specifically, the glass cover lid 112 covers the organic barrier layer 110 and the second cathode metal layer, and the glass cover lid 112 is configured to encapsulate the double-sided OLED display panel.

The double-sided OLED display panel provided by the embodiment of the present invention employs two glass substrates to achieve double-sided display of the OLED backplate, which can reduce an overall thickness of the double-sided OLED display panel, simplify the process, and further decrease the manufacturing cost of the double-sided OLED display panel.

Figure 2:
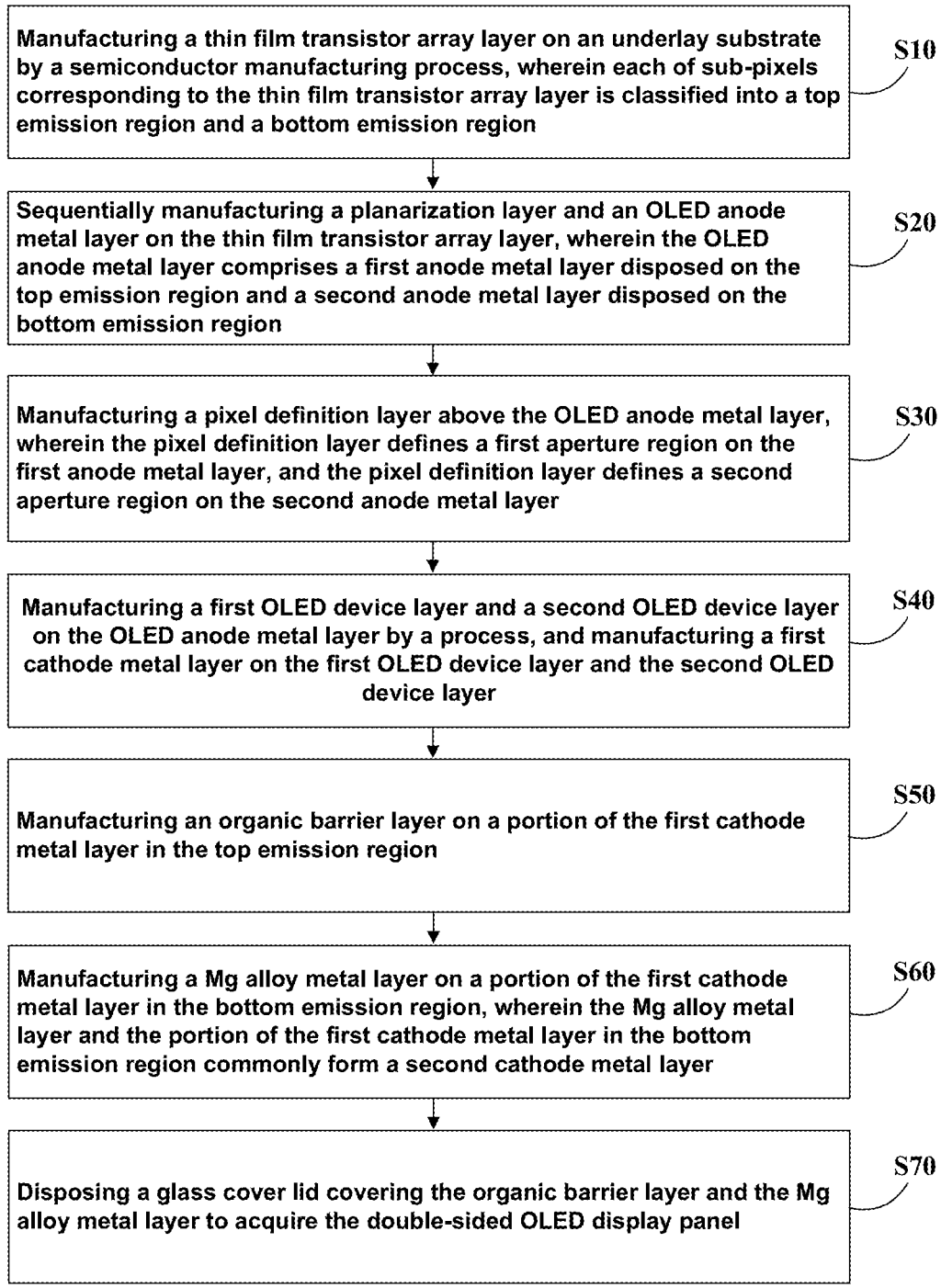
FIG. 2 is a flowchart of a double-sided OLED display panel manufacturing method of an embodiment of the present invention.

With reference to FIG. 2, FIG. 2 is a flowchart of a double-sided OLED display panel manufacturing method of an embodiment of the present invention. The method comprises steps S10 to S70 as follows:

The step S10 comprises manufacturing a thin film transistor array layer 14 on an underlay substrate 13 by a semiconductor manufacturing process, and each of sub-pixels corresponding to the thin film transistor array layer 14 is classified into a top emission region 11 and a bottom emission region 12.

Figure 3A:
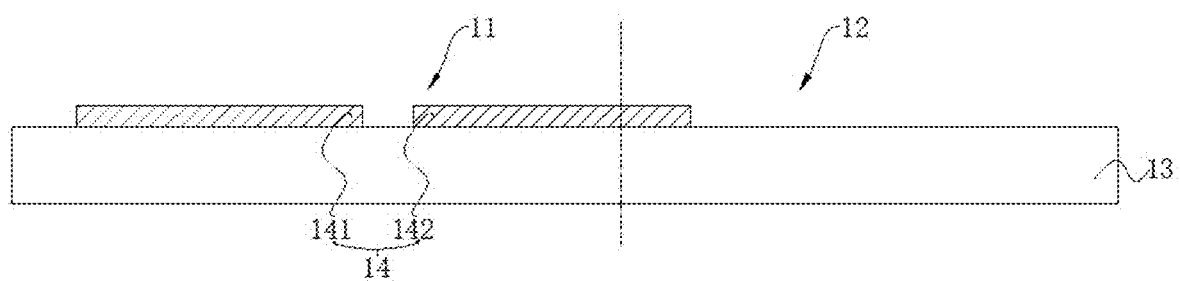
FIGS. 3A to 3G are schematic structural views of a double-sided OLED display panel manufacturing method of an embodiment of the present invention.

Specifically, the step S10 further comprises steps as follows:

First, an underlay substrate 13 provided, and the underlay substrate 13 is made of a flexible underlay material, which is preferably polyimide. Then, the thin film transistor array layer 14 is manufactured on the underlay substrate 13 by the semiconductor manufacturing process, each of the sub-pixels corresponding to the thin film transistor array layer 14 is classified into the top emission region 11 and the bottom emission region 12. Specifically, the thin film transistor array layer 14 comprises a plurality of thin film transistors arranged in an array. Each of the thin film transistors comprises a source electrode, a drain electrode, a gate electrode, and an active layer. The thin film transistor array layer 14 comprises a first thin film transistor array layer 141 configured to drive the top emission region 11 and a second thin film transistor array layer 142 configured to drive the bottom emission region 12. The first thin film transistor array layer 141 is located in the top emission region 11, and the second thin film transistor array layer 142 is located entirely or partially in the top emission region 11. Because the device in the thin film transistor array layer 14 is made of metal and metal has a light shielding characteristic, the second OLED device layer 182 in the bottom emission region 12 needs to emit light through the second thin film transistor array layer 142 on a bottom, and the first OLED device layer 181 in the top emission region 11 directly emits light without passing through the bottom of the first thin film transistor array layer 141. Therefore, disposing the second thin film transistor array layer 142 entirely or partially in the top emission region 11 increases an aperture ratio of the bottom emission region 12, as shown in FIG. 3A.

The step S20 comprises sequentially manufacturing a planarization layer 15 and an OLED anode metal layer 16 on the thin film transistor array layer 14, and the OLED anode metal layer 16 comprises a first anode metal layer 161 disposed in the top emission region 11 and a second anode metal layer 162 disposed in the bottom emission region 12.

Figure 3B:
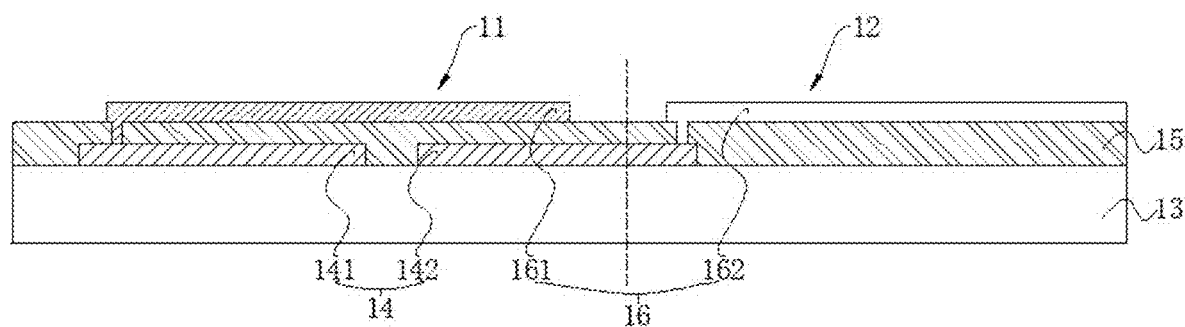

Specifically, the step S20 further comprises steps as follows:

First, the planarization layer 15 is manufactured on the thin film transistor array layer 14, the planarization layer 15 is disposed on the underlay substrate 13 and covers the thin film transistor array layer 14, and a material of the planarization layer 15 is preferably an organic photoresist. After, the OLED anode metal layer 16 is manufactured on the planarization layer 15, and the OLED anode metal layer 16 comprises the first anode metal layer 161 disposed in the top emission region 11 and the second anode metal layer 162 disposed in the bottom emission region 12. Specifically, the first anode metal layer 161 is located in the top emission region 11, the first anode metal layer 161 is disposed on the planarization layer 15 and is connected to the first thin film transistor array layer 141 through a first via hole. A material of the first anode metal layer 161 a triple-layered indium tin oxide/silver/indium tin oxide (ITO/Ag/ITO) conductive layer of a triple-layer composite film structure. The second anode metal layer 162 is located in the bottom emission region 12, and the second anode metal layer 12 is disposed on the planarization layer 15 and is connected to the second thin film transistor array layer 142 through a second via hole. A material of the second anode metal layer 162 is a single-layered ITO conductive layer, as shown in FIG. 3B.

The step S30 comprises manufacturing a pixel definition layer 17 above the OLED anode metal layer 16, the pixel definition layer 17 defines a first aperture region 171 on the first anode metal layer 161, and the pixel definition layer 17 defines a second aperture region 172 on the second anode metal layer 162.

Figure 3C:
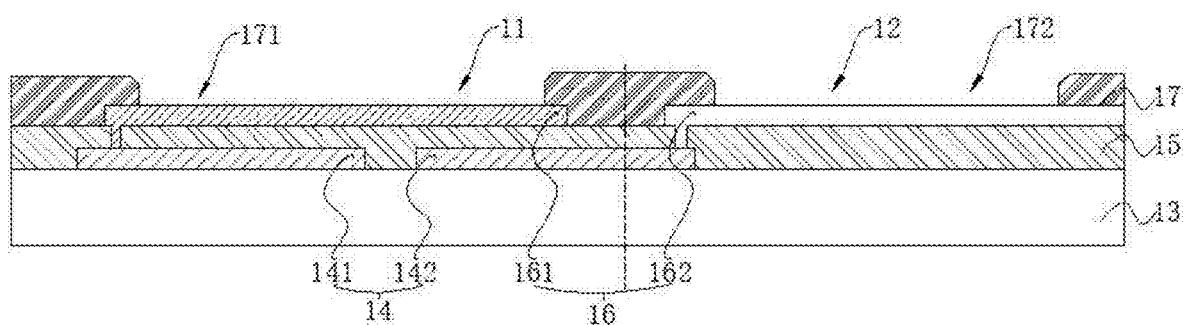

Specifically, the S30 further comprises steps as follows:

The pixel definition layer 17 is manufactured on the OLED anode metal layer 16, the pixel definition layer 17 defines the first aperture region 171 on the first anode metal layer 161, and the pixel definition layer 17 defines the second aperture region 172 on the second anode metal layer 162. A material of the pixel definition layer 17 is preferably an organic photoresist, as shown in FIG. 3C.

The step S40, manufacturing a first OLED device layer 181 and a second OLED device layer 182 on the OLED anode metal layer 16 by a process, and manufacturing a first cathode metal layer 19 on the first OLED device layer 181 and the second OLED device layer 182.

Figure 3D:
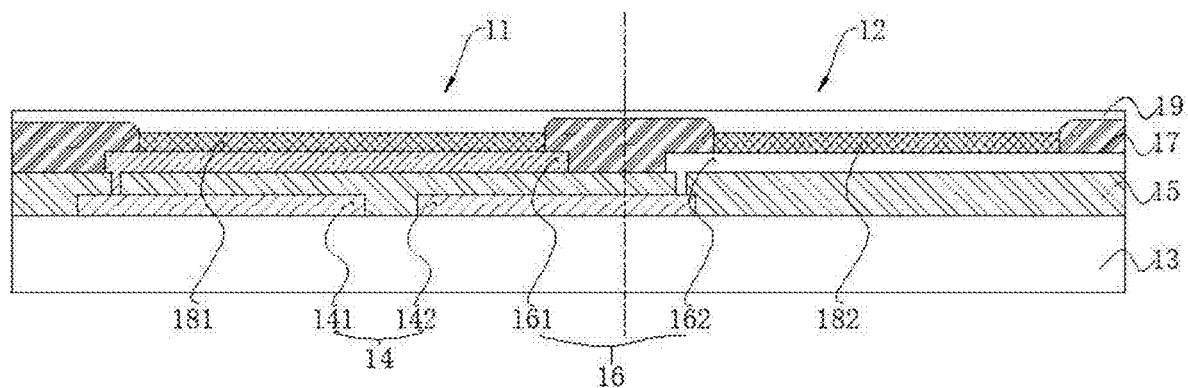

Specifically, the S40 further comprises steps as follows:

First, the first OLED device layer 181 and the second OLED device layer 182 are manufactured on the OLED anode metal layer 16 by a fine metal mask (FMM) vapor deposition process or a jet-ink printing process, and the first OLED device layer 181 is disposed on the first anode metal layer 161 and is located in an aperture region of the top emission region 11. The second OLED device layer 182 is disposed on the second anode metal layer 162 is located in an aperture region of the bottom emission region 12. Preferably, both the first OLED device layer 181 and the second OLED device layer 182 are a white light emitting material. After, a translucent cathode material is manufactured on each of the first OLED device layer 181 and the second OLED device layer 182 by a common metal mask vapor deposition process to form the first cathode metal layer 19. A material of the first cathode metal layer 19 is preferably a double-layered magnesium/silver (Mg/Ag) conductive layer of a double-layer composite film structure, as shown in FIG. 3D.

The step S50 comprises manufacturing an organic barrier layer 110 on a portion of the first cathode metal layer 19 in the top emission region 11.

Figure 3E:
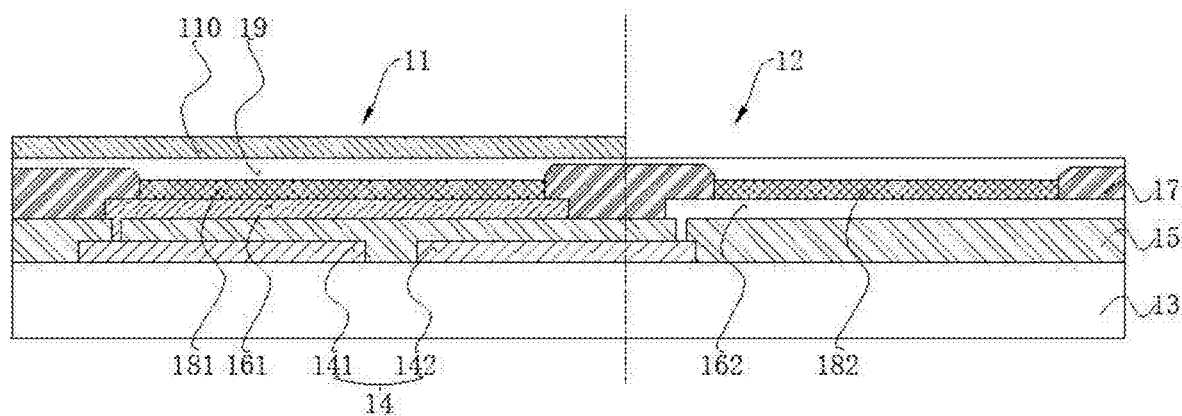

Specifically, the step S50 further comprises steps as follows:

The organic barrier layer 110 is vapor-deposited and formed on the portion of the first cathode metal layer 19 in the top emission region 11 by the fine metal mask (Fine Metal Mask, FMM) vapor deposition process. The organic barrier layer 110 is selected from self-assembling optional organic materials, such materials suppress later vapor deposition of a metal film of a self-assembling optional metal material thereon, as shown in FIG. 3E.

The step S60 comprises manufacturing a magnesium (Mg) alloy metal layer 111 on a portion of the first cathode metal layer 19 in the bottom emission region 12, and the Mg alloy metal layer 111 and the portion of the first cathode metal layer 19 in the bottom emission region 12 form a second cathode metal layer.

Figure 3F:
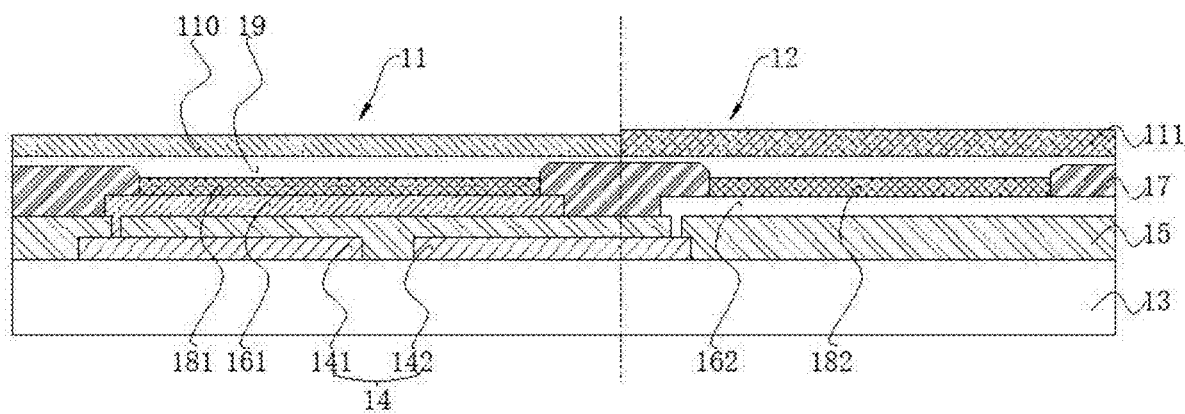

Specifically, the step S60 further comprises steps as follows:

The Mg alloy metal layer 111 is formed on the portion of the first cathode metal layer 19 in the bottom emission region 12 by a common metal mask vapor-depositing a self-assembling optional Mg alloy metal. The organic barrier layer 110 restricts a boundary of a side of the Mg alloy metal layer 111 near the top emission region 11 in the bottom emission region 12. Controlling the vapor deposition process can manufacture cathode with a thickness required by the bottom emission region 12 to lower an impedance of the entire display panel cathode and to prevent uneven brightness resulting from an over high impedance of the cathode, as shown in FIG. 3F.

The step S70 comprises disposing a glass cover lid 112 covering the organic barrier layer 110 and the Mg alloy metal layer 111 to acquire the double-sided OLED display panel.

Figure 3G:
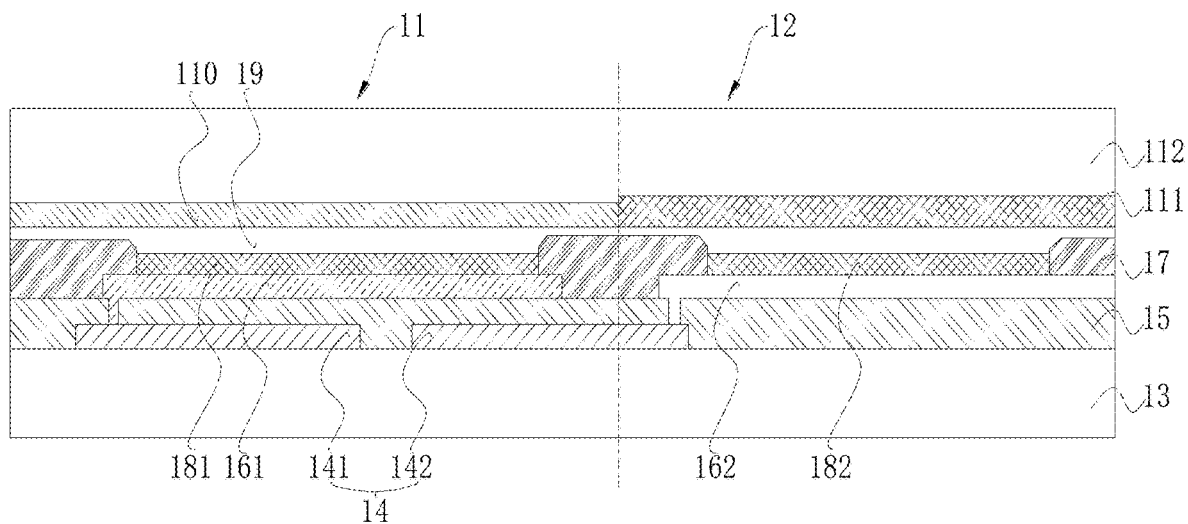

Specifically, the step S70 further comprises steps as follows:

A glass cover lid 112 covers the organic barrier layer 110 and the Mg alloy metal layer 111 to encapsulate the double-sided OLED display panel to acquire the double-sided OLED display panel, as shown in FIG. 3G.

Figure 4:
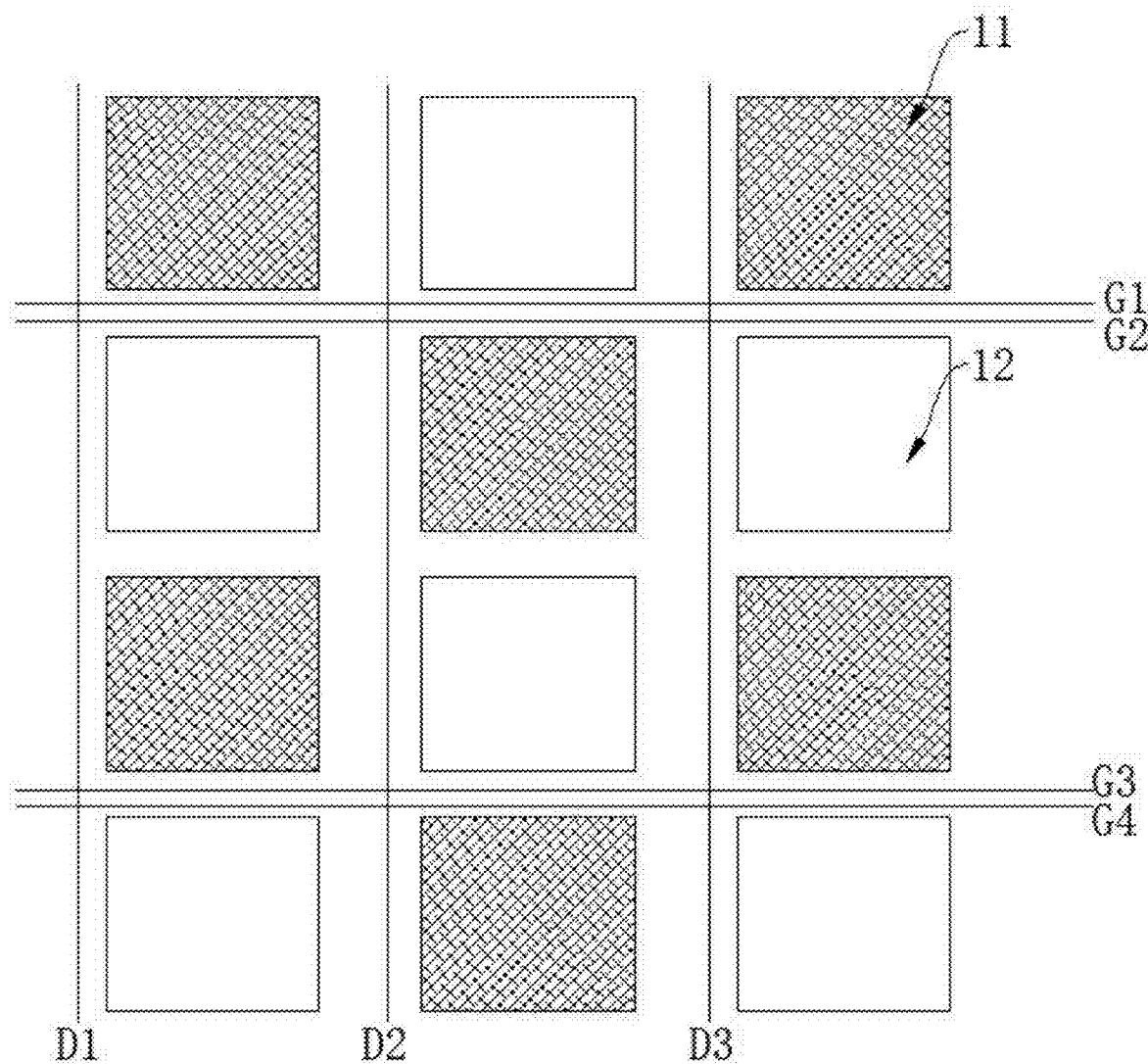
FIG. 4 is a schematic structural view of a pixel of a double-sided OLED display panel of an embodiment of the present invention.

With reference to FIG. 4, FIG. 4 is a schematic structural view of a pixel of a double-sided OLED display panel of an embodiment of the present invention. Each of columns of the sub-pixels (for example, red sub-pixels) of the double-sided OLED display panel of the present invention is classified into the bottom emission region 12 and the top emission region 11 that are controlled respectively by two individual scan lines (G1&G2) independently and share a required grayscale voltage inputted from the same data line (D1). Therefore, the top emission region 11 and the bottom emission region 12 can display different images depending on needs.

Figure 5:
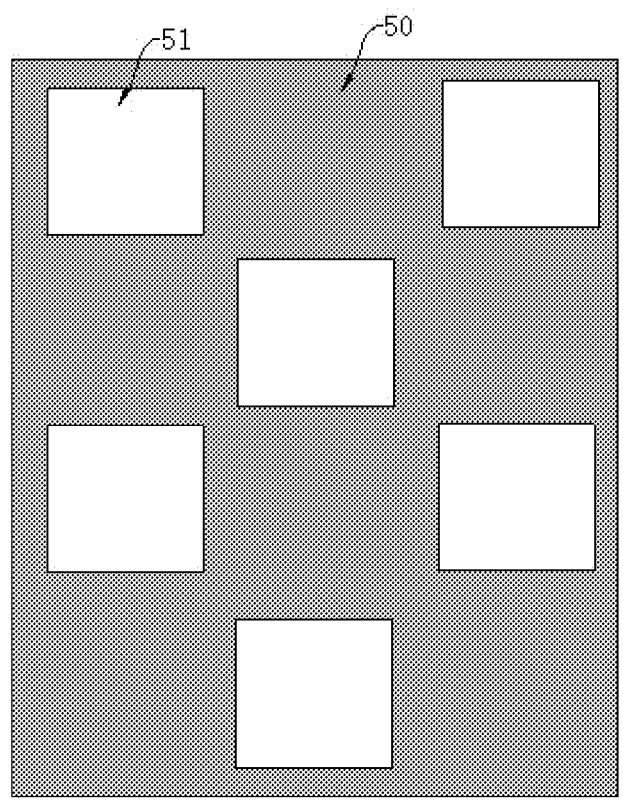
FIG. 5 is a schematic view of apertures of a fine metal mask plate corresponding to the pixel design of FIG. 4 used by an organic barrier layer in a double-sided OLED display panel of an embodiment of the present invention.

With reference to FIG. 5, FIG. 5 is a schematic view of apertures of a fine metal mask plate corresponding to the pixel design of FIG. 4 used by an organic barrier layer in a double-sided OLED display panel of an embodiment of the present invention. The organic barrier layer employs a self-assembling optional organic material and is vapor-deposited by a fine metal mask (FMM) plate 50, and is vapor-deposited through the fine metal mask plate 50 and aperture regions 51 corresponding to the top emission region. FIG. 5 such FMM aperture pattern has a greater process window and and a more even mechanical strength.

As described above, the present invention, by dividing each of the sub-pixels of one OLED backplate into the top emission region and the bottom emission region, achieves double-sided display of the OLED backplate, which can reduce an overall thickness of the double-sided OLED display panel, simplify the process, and further decrease the manufacturing cost of the double-sided OLED display panel.

It can be understood that for a person of ordinary skill in the art, equivalent replacements or changes can be made according to the technical solution of the present invention and its inventive concept, and all these changes or replacements should belong to the scope of protection of the appended claims of the present invention.

What is claimed is:

1. A double-sided organic light emitting diode (OLED) display panel, wherein the double-sided OLED display panel comprises a plurality of sub-pixels, each of the sub-pixels comprises a top emission region and a bottom emission region, wherein the double-sided OLED display panel comprises: an underlay substrate, a thin film transistor array layer, a planarization layer, a first anode metal layer and a second anode metal layer disposed on the planarization layer and arranged as a same layer, a pixel definition layer, a first OLED device layer and second OLED device layer arranged as a same layer, a first cathode metal layer and a second cathode metal layer disposed on the pixel definition layer and arranged as a same layer, an organic barrier layer disposed on the first cathode metal layer, and a glass cover lid covering the organic barrier layer and the second cathode metal layer;

wherein the first anode metal layer, the first OLED device layer, the first cathode metal layer, and the organic barrier layer is located in the top emission region, the second anode metal layer, the second OLED device layer, and the second cathode metal layer are located in the bottom emission region; in each of columns of the sub-pixels, the top emission region is connected to a scan line, the bottom emission region is connected another scan line, and the top emission region and the bottom emission region share a data line.

2. The double-sided OLED display panel as claimed in claim 1, wherein the thin film transistor array layer comprises a first thin film transistor array layer configured to drive the top emission region and a second thin film transistor array layer configured to drive the bottom emission region, the first thin film transistor array layer is located in the top emission region, and the second thin film transistor array layer is located entirely or partially in the top emission region.

3. The double-sided OLED display panel as claimed in claim 1, wherein the first anode metal layer is a triple-layered indium tin oxide/silver/indium tin oxide (ITO/Ag/ITO) conductive layer, and the second anode metal layer is a single-layered ITO conductive layer.

4. The double-sided OLED display panel as claimed in claim 1, wherein the first cathode metal layer is a double-layered magnesium/silver (Mg/Ag) conductive layer, the second cathode metal layer comprises a portion of the first cathode metal layer and a Mg alloy metal layer that are stacked on each other from bottom to top.

5. The double-sided OLED display panel as claimed in claim 4, wherein the organic barrier layer restricts a boundary of a side of the Mg alloy metal layer near the top emission region in the bottom emission region.

6. A double-sided organic light emitting diode (OLED) display panel, wherein the double-sided OLED display panel comprises a plurality of sub-pixels, each of the sub-pixels comprises a top emission region and a bottom emission region, wherein the double-sided OLED display panel comprises: an underlay substrate, a thin film transistor array layer, a planarization layer, a first anode metal layer and a second anode metal layer disposed on the planarization layer and arranged as a same layer, a pixel definition layer, a first OLED device layer and second OLED device layer arranged as a same layer, a first cathode metal layer and a second cathode metal layer disposed on the pixel definition layer and arranged as a same layer, an organic barrier layer disposed on the first cathode metal layer, and a glass cover lid covering the organic barrier layer and the second cathode metal layer;

wherein the first anode metal layer, the first OLED device layer, the first cathode metal layer, and the organic barrier layer is located in the top emission region, the second anode metal layer, the second OLED device layer, and the second cathode metal layer are located in the bottom emission region.

7. The double-sided OLED display panel as claimed in claim 6, wherein the thin film transistor array layer comprises a first thin film transistor array layer configured to drive the top emission region and a second thin film transistor array layer configured to drive the bottom emission region, the first thin film transistor array layer is located in the top emission region, and the second thin film transistor array layer is located entirely or partially in the top emission region.

8. The double-sided OLED display panel as claimed in claim 6, wherein the first anode metal layer is a triple-layered indium tin oxide/silver/indium tin oxide (ITO/Ag/ITO) conductive layer, and the second anode metal layer is a single-layered ITO conductive layer.

9. The double-sided OLED display panel as claimed in claim 6, wherein the first cathode metal layer is a double-layered magnesium/silver (Mg/Ag) conductive layer, the second cathode metal layer comprises a portion of the first cathode metal layer and a Mg alloy metal layer that are stacked on each other from bottom to top.

10. The double-sided OLED display panel as claimed in claim 9, wherein the organic barrier layer restricts a boundary of a side of the Mg alloy metal layer near the top emission region in the bottom emission region.

11. A double-sided organic light emitting diode (OLED) display panel manufacturing method, wherein the method comprising:

a step S10, manufacturing a thin film transistor array layer on an underlay substrate by a semiconductor manufacturing process, wherein each of sub-pixels corresponding to the thin film transistor array layer is classified into a top emission region and a bottom emission region;

a step S20, sequentially manufacturing a planarization layer and an OLED anode metal layer on the thin film transistor array layer, wherein the OLED anode metal layer comprises a first anode metal layer disposed on the top emission region and a second anode metal layer disposed on the bottom emission region;

a step S30, manufacturing a pixel definition layer above the OLED anode metal layer, wherein the pixel definition layer defines a first aperture region on the first anode metal layer, and the pixel definition layer defines a second aperture region on the second anode metal layer;

a step S40, manufacturing a first OLED device layer and a second OLED device layer on the OLED anode metal layer by a process, and manufacturing a first cathode metal layer on the first OLED device layer and the second OLED device layer;

a step S50, manufacturing an organic barrier layer on a portion of the first cathode metal layer in the top emission region;

a step S60, manufacturing a magnesium (Mg) alloy metal layer on a portion of the first cathode metal layer in the bottom emission region, wherein the Mg alloy metal layer and the portion of the first cathode metal layer in the bottom emission region commonly form a second cathode metal layer; and a step S70, disposing a glass cover lid covering the organic barrier layer and the Mg alloy metal layer to acquire the double-sided OLED display panel.

12. The double-sided OLED display panel manufacturing method as claimed in claim 11, wherein in the step S10, the thin film transistor array layer comprises a first thin film transistor array layer configured to drive the top emission region and a second thin film transistor array layer configured to drive the bottom emission region, the first thin film transistor array layer is located in the top emission region, and the second thin film transistor array layer is located entirely or partially in the top emission region.

13. The double-sided OLED display panel manufacturing method as claimed in claim 11, wherein in the step S20, the first anode metal layer is a triple-layered indium tin oxide/silver/indium tin oxide (ITO/Ag/ITO) conductive layer, and the second anode metal layer is a single-layered ITO conductive layer.

14. The double-sided OLED display panel manufacturing method as claimed in claim 11, wherein in the step S40, the first cathode metal layer is a double-layered magnesium/silver (Mg/Ag) conductive layer.

* * * * *